United States Patent
Paranjpe et al.

(10) Patent No.: US 6,204,204 B1
(45) Date of Patent: Mar. 20, 2001

(54) METHOD AND APPARATUS FOR DEPOSITING TANTALUM-BASED THIN FILMS WITH ORGANMETALLIC PRECURSOR

(75) Inventors: Ajit P. Paranjpe, Sunnyvale; Mehrdad M. Moslehi, Los Altos; Randhir S. Bubber; Lino A. Velo, both of San Ramon, all of CA (US)

(73) Assignee: CVC Products, Inc., Rochester, NY (US)

( * ) Notice: Subject to any disclaimer, the term of this patent is extended or adjusted under 35 U.S.C. 154(b) by 0 days.

(21) Appl. No.: 09/282,952

(22) Filed: Apr. 1, 1999

(51) Int. Cl.$^7$ ............... H01L 21/302; H01L 21/461; C23C 16/14; C23C 16/22; C23C 16/34; H05H 1/24

(52) U.S. Cl. ............... 438/785; 427/248.1; 427/255.391; 427/255.394; 427/569

(58) Field of Search ................... 438/785, 656, 438/682; 427/248.1, 255.391, 255.394, 569

(56) References Cited

U.S. PATENT DOCUMENTS

| | | | |
|---|---|---|---|
| 4,970,093 | * 11/1990 | Sievers et al. | |
| 5,112,448 | 5/1992 | Chakravorty | 205/118 |
| 5,464,656 | * 11/1995 | Verkade. | |
| 5,674,787 | 10/1997 | Zhao et al. | 437/230 |
| 5,723,028 | 3/1998 | Poris | 204/231 |
| 5,763,953 | 6/1998 | Iijima et al. | 257/762 |
| 5,843,516 | * 12/1998 | Derbenwick et al. | |
| 5,852,088 | * 12/1998 | Dismukes et al. | |
| 5,916,359 | * 6/1999 | Baum et al. | |
| 6,015,917 | * 1/2000 | Bhanadari et al. | |

FOREIGN PATENT DOCUMENTS

0698918 A1  2/1996  (EP) ............ H01L/21/3205

OTHER PUBLICATIONS

Strumm, et al., "Selectivity in low pressure chemical vapor deposition of copper from hexafluoroacetylacetonate–copper(1)–trimethylvinylsilane in the presence of water," Materials Science and Engineering, B23 1994, pp. 48–53, Feb. 1994.

Communication relating to the results of the Partial International Search for PUT/US99/15583, Dec. 20, 1999.

* cited by examiner

Primary Examiner—Richard Booth
Assistant Examiner—Ron Pompey
(74) Attorney, Agent, or Firm—Baker Botts L.L.P.

(57) ABSTRACT

A method and apparatus are disclosed for depositing a tantalum-containing diffusion barrier, such as a TaN barrier layer, by dissolving a tantalum-bearing organometallic precursor, such as PEMAT or PDEAT, in an inert, low viscosity, high molecular weight, low volatility solvent, such as octane, heptane, decane or toluene. The precursor-solvent solution is vaporized and flowed over a substrate to deposit the barrier. The precursor solution has a viscosity substantially similar to that of the solvent by maintaining the ratio of precursor to solvent at a generally low value, such as approximately 10% precursor. The boiling point of the solvent is substantially similar to the boiling point of the precursor, such as within 50% of the precursor boiling point at one atmosphere, to enhance repeatability of barrier film quality. Resistivity of the barrier film is reduced by flowing a reactive gas with the precursor flow, the reactive gas reducing the carbon content of the barrier film, or by co-deposition of a resistivity-lowering metallic dopant with the precursor solution. Alternatively, resistivity is reduced by controlling the nitrogen content of the film by a post-deposition plasma treatment of the barrier with a reducing gas.

43 Claims, 2 Drawing Sheets

METHOD AND APPARATUS FOR DEPOSITING TANTALUM-BASED THIN FILMS WITH ORGANMETALLIC PRECURSOR

TECHNICAL FIELD OF THE INVENTION

The invention relates in general to the field of chemical-vapor deposition of a material layer, and more particularly to chemical vapor deposition of tantalum-containing barrier layers with an organometallic precursor for microelectronic device applications such as semiconductor chip interconnect diffusion barrier and memory chip capacitor electrode layers.

BACKGROUND OF THE INVENTION

As semiconductor integrated circuit device feature sizes shrink, high-performance and reliable interconnect technology using copper-based metallization becomes increasingly important. However, copper interconnect technology faces a number of important process integration and manufacturing challenges. For instance, copper diffuses relatively rapidly through many materials, including both metals and dielectrics, particularly, at temperatures above ~300° C. In a typical device, copper diffusion into the inter-metal dielectric (IMD) such as silicon dioxide results in current leakage between adjacent metal lines (i.e., line-to-line leakage) and degradation of Inter-level dielectric (ILD) breakdown field. If copper diffuses through the IMD and the pre-metal dielectric (PMD) into the device transistor region, device performance and reliability degrade significantly and the device may become nonfunctional. In addition, copper is prone to corrosion and generally must be passivated to maintain its electrical conductivity characteristics.

Difficulties with the forming of copper interconnects have lead to the development of barrier materials that separate the copper metallization regions from vulnerable device regions. These barrier materials hinder the diffusion of copper into the vulnerable regions. Effective barrier materials generally must possess several characteristics. One important characteristic is a low diffusion coefficient for copper. Copper tends to diffuse during thermal cycling, such as thermal cycling experienced by a substrate during multilevel metallization processes, as well as during actual device operation under applied electric fields. Thus, barrier materials must generally remain thermally stable, including good structural stability so that the barrier remains effective during processing. Another important characteristic for a barrier material is that it generally must provide good adhesive interfaces for supporting deposition of copper on the barrier. Thus, the barrier material should have excellent adhesion to its underlying layer, such as oxide or low-k dielectric underlying layers, and provide excellent adhesion to a copper layer deposited on the barrier material. Further, the barrier should provide a good nucleation surface to promote <111> texture in the overlying copper layer such as overlying layers deposited by CVD, PVD, and/or electrochemical deposition (ECD).

Another important barrier characteristic is low electrical resistivity and via contact interface resistance. For instance, if a barrier is deposited between an underlying copper metal line and an overlying copper via plug, then the barrier should provide minimal increase of resistance for transmission of electric current between the underlying metal line and the via plug. As an example, amorphous barriers of refractory metals typically exhibit good diffusion barrier properties but also typically increase resistance between overlying and underlying copper layers in excess of acceptable levels. This increase is likely due to the relatively high resistivity of the barrier layer.

Another important characteristic of a barrier material is that its deposition should occur with good step coverage in high-aspect-ratio device features such as the dual-damascene trench and via structures. Barrier thickness on feature sidewall and bottom surfaces should be comparable to barrier thickness in the field, and barrier structure should be invariant with wafer topography. As an example of the importance of good step coverage, consider deposition of a barrier with a minimum thickness of 75 Å needed to prevent copper diffusion. If deposition of the barrier is accomplished with 25% step coverage, then a barrier thickness of 300 Å is needed to insure that a minimum thickness of 75 Å is accomplished throughout the interconnect structure. By comparison, if step coverage of the barrier is 75%, then a minimum barrier thickness of 75 Å can be accomplished with barrier deposition of a thickness of 100 Å over the field region.

In an attempt to meet the requirements for copper metallization barriers, a number of advanced barrier materials have been developed to supplant traditional barriers used for aluminum and tungsten metallization, such as TiN and TiW. For instance, Ta, TaN, NbN, $WN_x$ and ternary barriers such as TiSiN, TaSiN, WSiN, and WBN all support copper metallization with varying degrees of success. However, these materials are generally deposited with physical vapor deposition (PVD) which provides limited step and bottom coverage, putting the usefulness of these (PVD) barrier materials in doubt as device dimensions continue to shrink.

SUMMARY OF THE INVENTION

Therefore a need has arisen for an effective method for depositing a barrier material which provides improved step coverage of the material on device structures to achieve uniform, conformal, and symmetric deposition of the material in terms of barrier thickness and microstructure.

A further need exists for a method for depositing a barrier material with minimal electrical resistivity.

A further need exists for a method for depositing a barrier material which provides good adhesion to underlying and overlying material layers and which provides a good nucleation surface for supporting deposition of copper in an overlying copper layer.

In accordance with the present invention a method for depositing a refractory metal nitride barrier, such as a tantalum-based barrier, is provided that substantially reduces disadvantages and problems associated with previously developed methods for depositing interconnect metallization barrier materials. An organometallic precursor having a refractory metal, such as tantalum, titanium, molybdenum, niobium, and tungsten, is dissolved in an inert, low viscosity, high molecular weight, and low volatility solvent. The precursor solution is then vaporized and flowed over a substrate having device formations to allow thermal or reactive decomposition of the precursor for deposition of tantalum or a tantalum-containing barrier on the substrate.

In one embodiment, a precursor for depositing TaN, such as PEMAT or PDEAT sold by ATMI, is dissolved in an organic solvent having a generally heavy molecular weight, such as a molecular weight of greater than 90. Other characteristics of the organic solvent may include a boiling point substantially similar to the boiling point of the precursor, such as a boiling point at one atmosphere that falls within 50% of the precursor boiling point at one atmosphere. The ratio of solvent to precursor in the precursor solution may be adjusted to a level that establishes the viscosity of the precursor solution substantially to that of the solvent and further that increases the precursor solution liquid flow rate for a given deposition thickness by an order of magnitude.

For example, a TaN precursor, such as PEMAT, is dissolved in a solvent, such as octane, to provide a 10% precursor solution. In addition to octane, other potentially useful solvents include heptane, decane and toluene. Substantial precursor dilution enhances flow rate control required for the deposition of thin barriers.

In another embodiment of the present invention, the electrical resistivity of the tantalum-containing barrier is reduced by flowing a reactive gas with the vaporized precursor solution over the substrate during deposition of the tantalum-containing barrier. The reducing gas may be energized via a plasma discharge. For example, reactive gases such as $NH_3$, $SiH_4$, metal hydrides and metal halides (e.g., $WF_6$) help to reduce the resistivity of a TaN barrier. These gases eliminate or reduce amide groups associated with the deposition reaction by forming volatile amines, thereby reducing carbon incorporation into the deposited TaN film. For instance, in the case of an $NH_3$ reactive gas, carbon within the barrier film is replaced by nitrogen. Similarly, in the case of $SiH_4$ reactive gas, silicon replaces carbon.

In another embodiment, once a TaN barrier is formed, resistivity of the barrier may be further reduced by exposing the barrier to a reducing gas, such as an $Ar/H_2$ plasma, for reducing the nitrogen content of the barrier. Post-deposition plasma treatment with the reducing gas may be performed in multiple alternating cycles of deposition and plasma treatment in order to reduce nitrogen content through the barrier thickness. For example, plasma treatment with the reducing gas may be performed for every 25–50 Å of TaN deposition.

In another embodiment, the resistivity of a TaN barrier may be reduced by doping the barrier with a dopant material. For instance, co-deposition of a metal such as platinum in conjunction with the TaN precursor solution in an $H_2$ or $NH_3$ ambient may result in reduced resistivity of the barrier film. In this example, the catalytic nature of platinum in the presence of the $H_2$ ambient reduces carbon incorporation into the barrier layer. The precursor ligands are hydrogenated to their volatile forms leading to a platinum-doped barrier with low carbon content, and also reducing the reaction temperature, thus enhancing barrier deposition compatibility with low K dielectrics. Moreover, incorporation of platinum into the TaN barrier material, which may also include carbon, using MOCVD process, can reduce the barrier resistivity and improve adhesion of subsequently deposited copper seed and fill layers.

The present invention provides a number of important technical advantages. One important technical advantage is that it supports deposition of a thin and relatively conformal film of TaN to form a barrier having a low diffusion coefficient for copper. The excellent step coverage and conformality of the barrier reduces the necessary deposited barrier thickness, thus, improving device fabrication process with enhanced interconnect performance. The use of an inert, low viscosity, high molecular weight, low volatility solvent provides enhanced deposition rate control for conformal and symmetric deposition of TaN with a thickness that scales along with device feature sizes. The use of the solvent also provides barrier layers with uniform microstructure and film properties on field, sidewall, and bottom surfaces of the device features.

Another important technical advantage of the present invention is that it supports deposition of thin barrier layers with reduced resistivity. By flowing a precursor solution over a substrate in the presence of appropriate reactive gases, conductivity-suppression impurities such as carbon are removed from the as-deposited film to provide improved film conductivity. Further, by treating a film with reducing gases, nitrogen content is controlled to support optimal barrier qualities with reduced resistivity.

Another important technical advantage of the present invention is that the TaN barrier film obtains good adhesion to underlying layers and supports deposition of copper overlying layers with good adhesion by controlled incorporation of a dopant such as platinum into the barrier layer. Further, the TaN barrier provides a good nucleation surface to promote optimal texture in an overlying copper layer. Also, when co-deposition with a dopant such as platinum or another metal is used, improved resistivity is provided along with improved adhesion, nucleation and reduced deposition temperatures.

BRIEF DESCRIPTION OF THE DRAWINGS

A more complete understanding of the present invention and advantages thereof may be acquired by referring to the following description taken in conjunction with the accompanying drawings, in which like reference numbers indicate like features, and wherein.

DETAILED DESCRIPTION OF THE INVENTION

Preferred embodiments of the present invention are illustrated in the FIGUREs, like numerals being used to refer to like and corresponding parts of the various drawings.

One of the primary challenges associated with developing high-performance semiconductor chip interconnect technology having copper-based metallization is ensuring that new materials and related fabrication techniques have extendibility into future generations of devices. For true extendibility, new barrier deposition technology should preferably: meet the requirements for at least three chip technology generations, meaning at the present time at least through the 0.13 μm technology nodes, and beyond; provide a conformal and symmetric deposition of barrier material with a uniform thickness that scales easily along with the device feature sizes, such as barrier thickness being 10% of minimum device feature size; achieve similar microstructure/film properties on field, sidewall and bottom surfaces; and possess a wide process window and process latitude that is tolerant of variations in pre-process and post-processing fabrication steps. With these challenges in mind, PVD techniques will reach their limitation, at the 0.18 μm or 0.13 μm technology nodes and beyond, thus restricting their usefulness for deposition of barrier layers.

Figure 1:
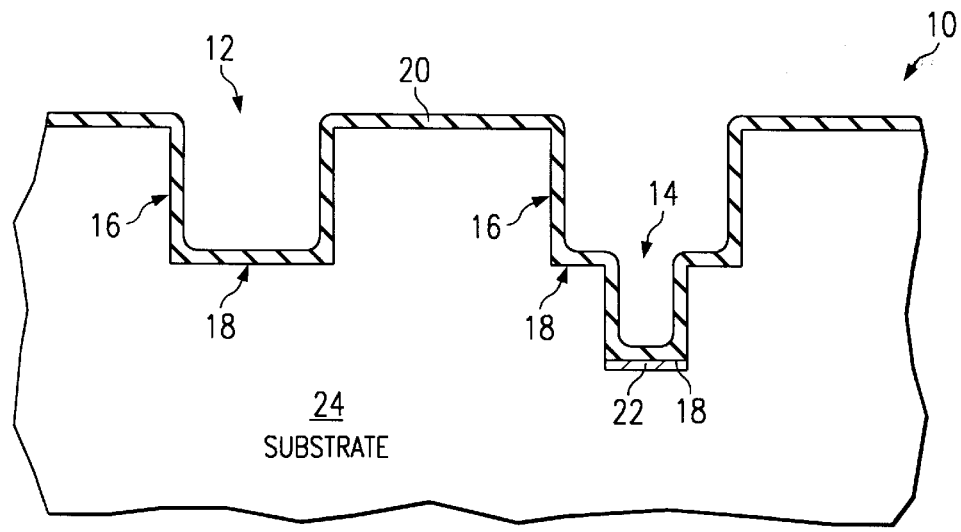
FIG. 1 depicts a side cut away view of a device formation.

The need for extendibility is better explained by reference to FIG. 1, which depicts a side cutaway view of a semiconductor device. Semiconductor device 10 includes a wire formation 12 and a via plug formation 14, each formation having side surfaces 16 and bottom surfaces 18. A diffusion barrier layer 20 is deposited across device 10 and on the side surface 16 and bottom surface 18 of formations 12 and 14. After deposition of the barrier layer 20, copper is deposited (by PVD, CVD, and/or electroplating) to fill wire formation 12 and via plug formation 14. Via plug formation 14 establishes an interface with lower layers of the device through contact with a copper underlying layer 22.

Barrier layer 20 prevents diffusion of copper from the wire formation 12 and via plug formation 14 into the inter-metal/inter-level dielectric medium and the substrate 24 in which the formations are etched. The copper medium within wire formation 12 and via plug 14 advantageously enhances the performance of device 10 due to the improved ability (higher conductivity) of copper to handle electronic currents as compared with other interconnect materials, such as aluminum. However, the improved electric conductivity and electronic current abilities of copper may be somewhat offset by barrier layer 20 in a number of ways. One potential degradation of the overall interconnect performance results from the use of relatively thick barrier layers. For instance, referring to wire formation 12, the thickness of the higher resistivity (e.g., $p \geq 200 \, \mu\Omega \cdot cm$) barrier layer 20 reduces the cross-sectional area within wire formation 12 that can accept lower resistivity (e.g., $p \leq 2 \, \mu l \cdot cm$) copper. Thus, as the width of wire formation 12 decreases, the thickness of the barrier layer 20 has an increased impact on the resistance per unit length of copper deposited within wire formation 12. Another degradation occurs where an overlaying copper interfaces through a barrier with another underlaying copper layer. Thus, the conductivity of the copper interface between via plug formation 14 and copper underlayer 22 decreases with an increase in resistivity of barrier layer 20.

To reduce barrier thickness, chemical-vapor deposition of the barrier material provides the desired extendibility which is normally lacking with physical-vapor deposition techniques. Thickness can be scaled down primarily due to the ability of chemical-vapor deposition to deposit a conformal material layer having relatively uniform thickness throughout the device features. As an example, conformality of greater than 85% is attainable with CVD techniques, and can allow barrier thickness to be scaled down to well below 150 Å as compared with a thickness of 250 Å typically needed for PVD techniques having 50% or less conformality (step coverage or bottom coverage).

Although CVD provides extendibility into future generations for barrier deposition, tantalum-based CVD precursors are difficult to deliver reliably to a wafer. As one example, PEMAT, a new organometallic precursor for CVD TaN sold by ATMI, is provided as a highly viscous thick paste which makes delivery to a substrate difficult. Typically, thick viscous precursors are dissolved within a solvent to reduce viscosity to acceptable levels for reliable delivery. PEMAT, for instance, is typically provided as a 66% solution in pentane. However, a series of deposition runs performed under identical process conditions with a PEMAT-pentane precursor solution shows variations in sheet resistance of the deposited films over the course of the deposition runs. A likely cause for the unpredictability and variability of the film characteristics deposited with a PEMAT-pentane precursor solution is that the pentane solvent evaporates preferentially in the section of the liquid line feeding the CVD vaporizer. Evaporated pentane vapors tend to dilute the precursor flowing into the CVD chamber, resulting in unpredictable precursor flow and increased process variability. This effect is more pronounced at higher vapor temperatures and can be reduced by cooling the liquid line inlet feeding the vaporizer.

A second problem associated with deposition using PEMAT is obtaining controllable flow rates of the PEMAT-pentane precursor solution. PEMAT, having a boiling point of approximately 185° C. at 1 atmosphere, is difficult to vaporize. At vaporizer temperatures of 85° to 100° C., only a very low flow of PEMAT can be vaporized with conventional metal-organic CVD vaporizers. For instance, a liquid flow rate of between 0.02–0.05 cc/min of PEMAT-pentane precursor solution can be reliably vaporized, while at higher flow rates, incomplete vaporization results in a buildup of liquid PEMAT in the vaporizer and liquid spots on the substrate wafer (as well as vaporizer clogging). Although low precursor solution flow rates are desirable to maintain deposition rates of between 100 and 300 Å per minute for a 100 to 150 Å film, the flow rates associated with a PEMAT-pentane precursor solution are too low for reliable flow rate control using conventional liquid flow control systems, such as micropumps from MKS and liquid mass flow controllers from Bronkhorst, STEC/Horiba and ATMI.

To provide repeatable precursor delivery for consistent film characteristics, a solution provided by the present invention is a substantial dilution of the precursor in a high molecular weight, low volatility, low viscosity, thermally stable solvent, such as octane. For instance, dilution of PEMAT to a 10% solution in octane substantially decreases the viscosity of the precursor solution to that of the octane solvent, allowing increases in the liquid precursor flow rates by an order of magnitude for a given deposition rate. The increased liquid flow rates result in more controllable flow using conventional flow control systems, enabling repeatable deposition of 100 to 150 Å barrier films. The octane solvent is thermally stable and inert, and therefore does not crack or react with other process gases in either the gas phase or at the substrate surface at deposition temperatures. Octane's relatively high molecular weight of approximately 114.23 ensures that the effective volumetric flow rate of octane is small compared to the flow rates of the other process gases. Further, octane's boiling point at 1 atmosphere of approximately 125.7° C. is better matched to the boiling point of PEMAT, reducing preferential vaporization of the octane solvent. Since additional dilution of PEMAT in the gas phase is limited, deposition rates and other film properties are not significantly affected. Also, vaporization of PEMAT is aided by the co-vaporization of octane with the PEMAT finely dispersed in the octane, resulting in vaporization at a molecular level. Octane's improved characteristics as a solvent enhance deposition repeatability to better than 3% (one-sigma wafer-to-wafer variability) with conventional liquid delivery systems. In other embodiments, other high molecular weight organic solvents may be used in place of octane, including heptane, with a molecular weight of 100.21 and boiling point of 98.42° C.; decane, with a molecular weight of 142 and boiling point of 174° C.; and toluene, with a molecular weight of 92.15 and boiling point of 110° C.

One additional difficulty associated with tantalum-containing precursor delivery, is that precursors, such as PEMAT, are reactive with air, and due to their low volatility, difficult to remove from delivery lines using conventional gas-based pump and purge cycles. The exposure in delivery lines containing trace amounts of precursor liquid to air, such as may commonly occur during routine servicing operations, often result in the formation of $Ta_2O_5$ particles which may be deposited on a substrate wafer during subsequent processing. These particles can cause frequent clogging of the delivery system vaporizer, which results in unreliable performance of the liquid precursor delivery system. In order to limit the formation of $Ta_2O_5$ particles, a separate solvent ampule interfaced with the liquid lines is used for flushing of the liquid lines with a solvent. By flushing with the solvent at multiple points, impurities are removed and the operating lifetimes of the vaporizer and other critical components are prolonged.

Figure 2:
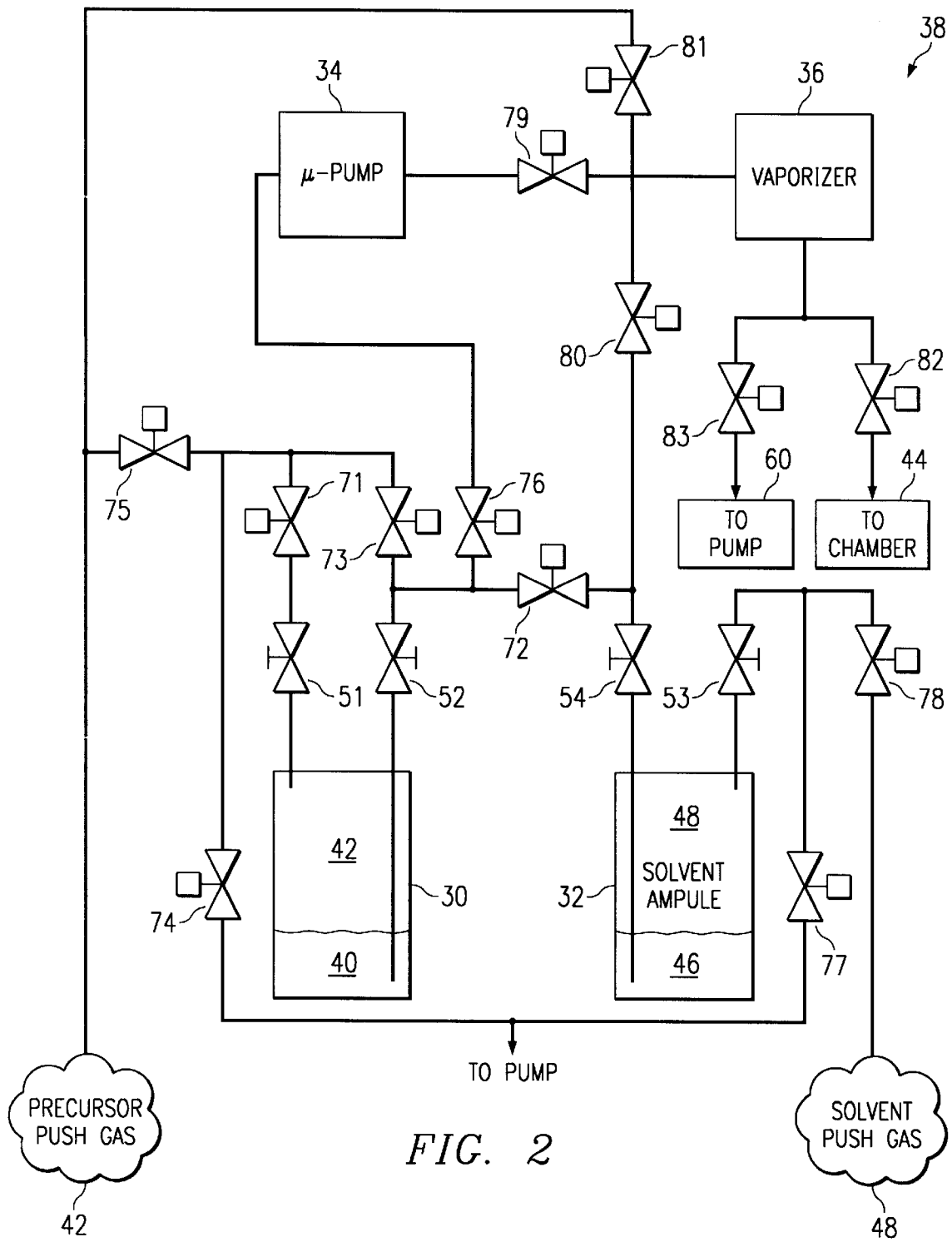
FIG. 2 depicts a multi-ampule vaporization system for minimizing deposition of impurities.

This enhanced flushing as well as the entire liquid delivery system can be better understood through consideration of an example flushing system. FIG. 2 depicts a single channel of a multi-ampule vaporization system for minimizing deposition of impurities. The system of FIG. 2 consists of a precursor ampule 30, a solvent ampule 32, a micro pump 34 (though other liquid flow controllers could also work), a vaporizer 36 and valving 38, which is generally closed. The channel could also include various flow control devices to improve controllability and reliability. These additional devices could include, for example, pressure sensors, flow rate monitors, filters, etc.

The channel of FIG. 2 helps limit the formation of $Ta_2O_5$ particles. During normal operation, a precursor push gas 42 fills the head space of the precursor ampule 30. The precursor push gas 42 enters the precursor ampule 30 after passing through a series of valves including pneumatic valve 75, pneumatic valve 71 and manual valve 51. A liquid precursor 40 is contained in the precursor ampule 30 and is forced by the precursor push gas 42 that fills the head space of the precursor ampule 30 into the micropump 34 through manual valve 52 and pneumatic valve 76. The liquid precursor then flows to the vaporizer 36 through pneumatic valve 79 and enters the chamber 44 after passing through pneumatic valve 82.

A solvent 46 is used to flush liquid precursor out of the FIG. 2 system. When flushing, solvent flow continues until the delivery system is relatively free of the low volatility liquid precursor. Solvent 46 flushes the lines between the precursor ampule 30 and the chamber 44, or between the vaporizer 36 and the chamber 44. When flushing between the precursor ampule 30 and the chamber 44, solvent 46 contained in solvent ampule 32 can be forced into the micropump 34 by a solvent push gas 48, which fills the head space of the solvent ampule 32. The solvent push gas 48 enters the solvent ampule 32 through pneumatic valve 78 and manual valve 53. The forced out solvent enters the micropump 34 after passing through manual valve 54, pneumatic valve 72 and pneumatic valve 76. After leaving the micropump 34, the solvent flows through pneumatic valve 79 and into the vaporizer 36. When flushing between the vaporizer 36 and the chamber 44, the solvent can be pushed directly into the vaporizer 36 through manual valve 54 and pneumatic valve 80, effectively bypassing the micropump 34.

The remaining valves, pneumatic valve 73, pneumatic valve 74, pneumatic valve 77, pneumatic valve 81 and pneumatic valve 83 in conjunction with other system valves comprise a maintenance system 38 and allow for maintenance of the system depicted in FIG. 2. Maintenance system 38 may be used for pumping and purging various sections of the liquid delivery system following a solvent flush. For example, by opening selected valves, the precursor push gas can be introduced to dry out sections of the system (i.e., to remove residual solvent). Maintenance system 38 can also be used to facilitate the installation of new ampules.

To manage delivery of high quality gas, a number of state dependent protocols may govern valve and line states such as valve openings and closings. The protocols extend the life of the liquid delivery system. The protocols may include, among others, a Gas Purge Protocol, a Chamber Shut-down Protocol and a Chamber Idling Protocol.

Gas Purge Protocol

Gas flow through the section of the vapor delivery line between the vaporizer 36 and a showerhead associated with the chamber 44 is intermittent (i.e., gas flows in the vapor delivery line during the deposition step only, because the flow is diverted directly to the pump otherwise). This means that flow through the vapor delivery line can be stagnant. It also means that the gas that flows in the vapor delivery line is frequently saturated with precursor vapor. As such, any precursor liquid that accumulates in the line has little chance of being removed, because gas that is already saturated with vapor cannot vaporize additional precursor liquid. Precursor liquid, therefore, accumulates in the line and degrades over time. This degradation can cause clogging.

To keep the vapor delivery line clean, a modified operating protocol that embodies two key features can be implemented. The first feature to be implemented is the maintaining of gas flow in the vapor delivery line a majority of the time so that the line is not stagnant. The second feature to be implemented is the periodic flowing of heated dry gas, gas that is not saturated with vapor, through the line to remove any precursor liquid that has condensed in the vapor delivery line. Example sequences implementing these features are further explained in the chamber shut-down protocol and the chamber idling protocol.

Chamber Shut-down Protocol

During a shut-down procedure, the vaporizer is not operating. To protect the system during this vaporizer down time, a shut-down protocol consisting of the following steps may be employed. First, isolate the precursor ampule 30 by closing the valve 52 on the outlet of the ampule 30. Open the solvent flush ampule 32. Increase the solvent flow gradually to achieve a certain flow rate through the vaporizer 36. Gradual ramping is helps to avoid forcing the residual precursor in the vaporizer 36 as a liquid stream. Gradual ramping can be accomplished by gradually opening the control valve 79 on the liquid inlet of the vaporizer 36. The gas pressure downstream of the vaporizer 36 should also be monitored to confirm that the solvent is being vaporized. The carrier gas remains flowing. The solvent and carrier gas flow into the pump 60 through the diverter line. Flow in the diverter line between the vaporizer 36 and the pump 60 is controlled by pneumatic valve 83. The vaporizer 36 is flushed with solvent for a preset time (e.g., 10–60 minutes) and then the vaporizer 36 temperature is reduced to a lower value. This lower value is high enough to evaporate trace amounts of precursor liquid but low enough to prevent precursor decomposition. For TaN precursors, the vaporizer temperature during normal operation could be 100–105° C., while the temperature during shut-down could be 90–95° C. After a preset time has elapsed, a purge gas (e.g., He) is introduced through the liquid inlet to sweep any residual solvent and precursor out of the vaporizer 36.

Chamber Idling Protocol

The chamber idling protocol can be automatically initiated between wafers, when system is idle and after shut-down sequence. One potential protocol could consist of the following steps. First, gas flow is initiated in the chamber 44 at maximum flow to rapidly achieve a preset pressure (e.g., 2.2 Torr). The preset pressure should exceed the pressure just downstream of the vaporizer 36 when the gas flow through the vaporizer 36 is flowing to the pump 60 through the diverter line. This elevated pressure ensures that the flow direction is from the chamber 44 to the vaporizer 36 when the showerhead isolation valve, pneumatic valve 82, is opened. During this step, the showerhead isolation valve 82 is closed and the chamber 44 is isolated from the pump 60. When the preset pressure is achieved, the gas flows into the chamber 44 are reduced so that the total gas flow into the chamber 44 is relatively low (e.g., 50 sccm) and the showerhead isolation valve 82 is opened. The gas then flows from the chamber 44, into the showerhead and finally into the pump 60 through the diverter line. In essence, the flow direction is reversed. As such, dry gas purges the showerhead and section of the line between the showerhead and the vaporizer 36 effectively removing any residual precursor liquid that may have accumulated in the showerhead or the vapor delivery line. This reverse flow sequence also prevents any unwanted deposition on the hot chuck that may arise due to residual precursor liquid in the delivery line. The chamber idling protocol could be designed to terminate automatically whenever a wafer transfers into the chamber 44. When completing the protocol, gas flows into the gas chamber 44 would be stopped, the shower isolation valve 82 closed and the chamber 44 pumped to the wafer transfer pressure by opening a throttle valve and a high vacuum isolation valve. Once the correct pressure has been obtained, wafer transfer can proceed. The discussed protocols used in conjunction with the liquid delivery system represented in FIG. 2 are examples of ways to help ensure that precursor does not contact air or cause contamination.

Although CVD of a tantalum-containing barrier enhances conformality of the barrier as compared with PVD, barrier layers deposited with CVD tantalum-containing precursors typically have relatively high as-deposited resistivities of greater than 5,000 $\mu\Omega\cdot$cm. TaN has a near insulating phase of $Ta_3N_5$; thus, films containing greater than 50% atomic nitrogen tend to exhibit relatively high resistivity. Also, residual carbon introduced by the decomposition or reduction reactions of organometallic precursor ligands, sometimes as great as 30% carbon content for a deposited film, tends to further increase electrical resistivity of the deposited barrier films. However, low resistivity of less than 650 $\mu\Omega$·cm is generally needed for obtaining reasonable via plug resistance, such as 1.5 ohms per via plug or less.

To reduce the as-deposited barrier resistivity, the present invention provides three solutions for use either individually or in combination. One solution for reducing resistivity of the as-deposited tantalum-containing MOCVD barrier films is the use of ultra-low pressure deposition of less than 10 mTorr. At lower deposition pressures, a larger fraction of the low volatility amide groups are eliminated, resulting in a barrier film with lower carbon content. However, the low deposition rate associated with ultra low pressure deposition reduces step coverage and does not significantly decrease resistivity to the degree needed for copper interconnects. Thus, low pressure deposition generally will not provide a sufficiently low resistance barrier film unless used in combination with other barrier resistivity lowering techniques.

Another solution for reducing film resistivity is to flow reactive gases with the precursor over the substrate wafer. For instance, reactive gases such as $NH_3$, $SiH_4$ and metal hydrides, provide H atoms that help eliminate amide groups by forming volatile amines, thus reducing carbon incorporation into the barrier film. In the case of $NH_3$, carbon in the film is replaced by atomic nitrogen, while in the case of $SiH_4$ or $GeH_4$ (or $Si_2H_6$ or $Ge_2H_6$), silicon or germanium replaces carbon. Similarly, using $SnH_4$ the barrier deposition process can reduce carbon incorporation by replacement of carbon atoms with Sn atoms, resulting in reduced barrier resistivity. For a TaN barrier film, the replacement of carbon by nitrogen with $NH_3$ can decrease the as-deposited TaN barrier resistivity to 1,500 $\mu\Omega$·cm. In contrast, replacement of carbon by silicon tends to increase film resistivity, while replacement of carbon with tin should reduce the barrier film resistivity.

Although deposition of a barrier film in the presence of $NH_3$ reacting gas reduces resistivity of the deposited film, the resistivity achieved is still higher than that typically provided by PVD TaN techniques. The relatively higher resistivity of CVD-processed films is attributable to the higher nitrogen content in CVD TaN films compared to the standard PVD-TaN films. Thus, to achieve resistivities comparable with PVD-TaN-deposited films, a reduction of nitrogen in the film or disruption of $Ta_3N_5$ phase is generally needed.

One method for reducing and optimizing nitrogen content and disrupting the $Ta_3N_5$ phase of a deposited barrier film is the post-deposition plasma treatment of the film in a reducing ambient, such as Ar/$H_2$ plasma. The introduction of atomic hydrogen, as is achieved with an Ar/$H_2$ plasma, eliminates some of the nitrogen in the deposited film, resulting in a lowering of resistivity to between 500 and 1000 $\mu\Omega$·cm. Post-deposition plasma treatment with atomic hydrogen plasma tends to reduce nitrogen content of a film at its near surface region, but has less effect below the surface. Thus, to reduce nitrogen content throughout a deposited film, plasma treatment may have to be performed every 25 to 50 Å of TaN deposition film thickness using a multi-step deposition and plasma treatment process. Reduction of nitrogen content through the thickness of the film is accomplished by cycling through multi-step barrier deposition and plasma treatment until a barrier of appropriate thickness is deposited.

Figure 3:
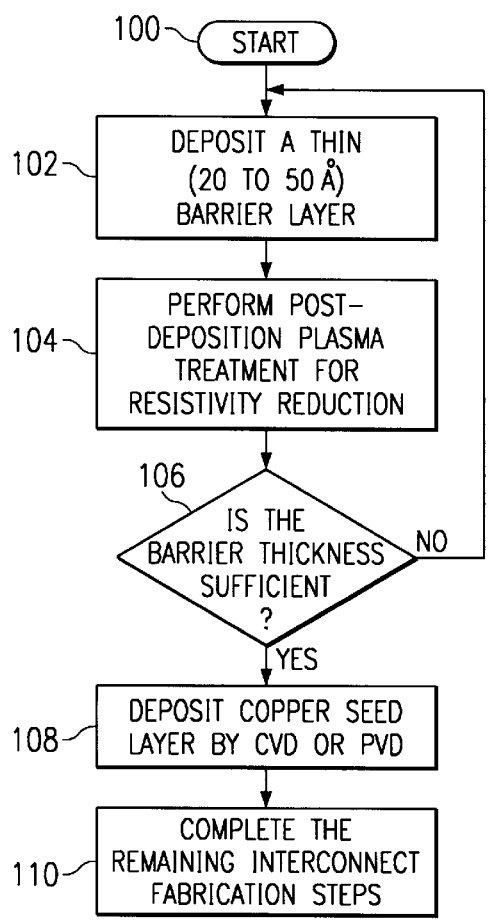
FIG. 3 depicts steps for incremental deposition of a barrier.

Referring to FIG. 3, a flow diagram depicts steps for incremental deposition of a barrier with incremental post-deposition plasma treatment. At step 100, the process starts with a substrate in need of a barrier or in need of deposition of other metal layers that incorporate nitrogen in the deposition process. Although MOCVD deposition of a TaN barrier presents one example of deposition of a metal layer with nitrogen, other applications may also be treated, such as memory capacitor electrode layers. At step 102, a thin film of 20 to 50 Å of a barrier layer is deposited. At step 104, post-deposition plasma treatment is performed for resistivity reduction. At step 106, a decision is made of whether the barrier thickness is sufficient. If additional barrier thickness is desired, additional deposition may be performed by returning to step 102. If the barrier has a adequate thickness, at step 108 a copper or other seed layer may be deposited by CVD or PVD so that, at step 110, the remaining steps for fabrication of the interconnect may be completed.

Another method for reducing resistivity of CVD TaN films (also applicable to other CVD-fabricated barrier materials such as $WN_x$ and TiN) is the doping of the CVD TaN film with a pure element using co-deposition of the dopant element. Co-deposition of TaN with platinum from a platinum-containing precursor in an $H_2$ ambient reduces carbon incorporation due to the catalytic nature of the platinum. The TaN barrier precursor ligands are hydrogenated to their volatile forms, leading to a platinum-doped barrier with low carbon content. The reduced carbon content helps to reduce the resistivity of the barrier film. In addition, catalysts such as platinum tend to reduce the reaction temperature, such as by 10° to 30° C., enabling deposition of the barrier at lower reaction temperatures. Lower temperatures are desirable for integration with low K dielectrics and improvement in step coverage. The amount of platinum within the TaN layer (or WN or TiN or MoN or NbN or related ternary barrier materials) can be optimized in order to achieve reduced electrical resistivity and improved barrier to interconnect metal (e.g., copper) adhesion while maintaining excellent diffusion barrier properties (e.g., against copper diffusion) and performance (e.g., electrical conductivity) of the interconnect wiring.

Although the present invention has been described in detail, it should be understood that various changes, substitutions and alterations can be made hereto without departing from the spirit and scope of the invention as defined by the appended claims.

What is claimed is:

1. A method for chemical-vapor deposition of a refractory metal nitride barrier on a substrate, the method comprising the steps of:

diluting a precursor with a solvent to form a precursor solution, the precursor comprising a refractory metal, the solvent having a generally high molecular weight;

vaporizing the precursor solution;

flowing the vaporized precursor solution over the substrate to deposit a barrier film by chemical vapor deposition;

ceasing the flow of the vaporized precursor; and reducing the resistivity of the barrier film by flowing a reducing gas over the substrate to reduce the nitrogen content.

2. The method of claim 1 wherein said refractory metal comprises Ta.

3. The method of claim 1 wherein said refractory metal is W.

4. The method of claim 1 wherein said refractory metal nitride comprises Nb.

5. The method of claim 1 wherein said refractory metal nitride comprises Ti.

6. The method of claim 1 wherein said refractory metal nitride is a ternary barrier.

7. The method of claim 1 wherein said refractory metal is Mo.

8. The method of claim 1 wherein said refractory metal is Ti.

9. The method of claim 2 wherein the solvent has a molecular weight of greater than 90.

10. The method of claim 1 wherein the solvent and precursor have substantially similar boiling points.

11. The method of claim 10 wherein the solvent has a boiling point at one atmosphere within 50% of the boiling point of the precursor boiling point at one atmosphere.

12. The method of claim 2 wherein the solvent comprises octane.

13. The method of claim 2 wherein the solvent comprises heptane.

14. The method of claim 2 wherein the solvent comprises decane.

15. The method of claim 2 wherein the solvent comprises toluene.

16. The method of claim 2 further comprising the step of flowing a reactive gas with the vaporized precursor solution to reduce the carbon content of the barrier.

17. The method of claim 16 wherein the reactive gas comprises $NH_3$.

18. The method of claim 17 wherein the reactive gas comprises $SiH_4$.

19. The method of claim 17 wherein the reactive gas comprises a metal hydride.

20. The method of claim 19 wherein said metal hydride comprises $SnH_4$.

21. The method of claim 1 wherein the reducing gas comprises $Ar/H_2$.

22. The method of claim 21 wherein said reducing gas is energized via plasma discharge.

23. The method of claim 1 further comprising the step of repeating said ceasing step and said flowing a reducing gas step until deposition on the substrate of a barrier film of predetermined thickness with reduced nitrogen content through the barrier thickness.

24. The method of claim 1 further comprising the step of co-depositing a metallic dopant with the precursor solution.

25. The method of claim 24 wherein the metallic dopant comprises platinum.

26. A method for chemical-vapor deposition of a TaN-containing barrier on a substrate, the method comprising the steps of:
diluting a precursor with a solvent to form a reduced viscosity precursor solution, the precursor comprising tantalum, the solvent having a boiling point at one atmosphere that falls within 50% of the precursor boiling point at one atmosphere;
vaporizing the precursor solution;
flowing the vaporized precursor solution over the substrate;
ceasing the flow of the vaporized precursor solution after deposition on the substrate of a barrier film of predetermined thickness; and
flowing a reducing gas comprising hydrogen over the substrate to reduce the resistivity of the barrier film by reducing the nitrogen content.

27. The method of claim 26 wherein the precursor comprises PEMAT.

28. The method of claim 26 wherein the precursor comprises PDEAT.

29. The method of claim 27 wherein the solvent comprises octane.

30. The method of claim 28 wherein the solvent comprises octane.

31. The method of claim 27 wherein the solvent comprises toluene.

32. The method of claim 28 wherein the solvent comprises toluene.

33. The method of claim 27 wherein the solvent comprises heptane.

34. The method of claim 28 wherein the solvent comprises heptane.

35. The method of claim 27 wherein the solvent comprises decane.

36. The method of claim 28 wherein the solvent comprises decane.

37. The method of claim 26 wherein the precursor solution comprises approximately 10% precursor and 90% solvent.

38. A method for depositing a tantalum-containing barrier layer on a substrate, the method comprising the steps of:
diluting an organometallic precursor with a solvent;
vaporizing the precursor solution;
flowing the precursor solution over the substrate, the precursor depositing tantalum-containing barrier on the substrate by thermal or reactive decomposition; and
flowing a reactive gas with the precursor flow, the reactive gas reducing the resistivity of the barrier by reducing carbon impurities associated with the barrier; and
flowing a reducing gas over the barrier to reduce the nitrogen content of the barrier.

39. The method of claim 38 wherein flowing a reducing gas further comprises:
ceasing the precursor solution and reactive gas flows at a predetermined barrier thickness; and
flowing a reducing gas over the substrate, the reducing gas reducing the resistivity of the barrier by reducing and optimizing nitrogen associated with the barrier layer.

40. The method of claim 39 further comprising the steps of:
flowing a resistivity-lowering metallic dopant precursor with the precursor solution and the reactive gas to co-deposit a dopant with the tantalum-containing barrier, the dopant reducing the resistivity of the barrier.

41. The method of claim 40 wherein the dopant comprises platinum.

42. The method of claim 39 wherein the reducing gas comprises hydrogen.

43. The method of claim 42 wherein the reducing gas comprises Ar plus $H_2$.

* * * * *